United States Patent
Arata et al.

(10) Patent No.: US 6,597,627 B2
(45) Date of Patent: Jul. 22, 2003

(54) CLOCK SWITCHING CIRCUITRY FOR AVOIDING CONFLICT OF DATA HANDLING OCCURING IN A MEMORY

(75) Inventors: Yuichi Arata, Chiba (JP); Naoya Kimura, Chiba (JP); Hideaki Odagiri, Chiba (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 10/103,844

(22) Filed: Mar. 25, 2002

(65) Prior Publication Data

US 2003/0031080 A1 Feb. 13, 2003

(30) Foreign Application Priority Data

Aug. 13, 2001 (JP) ........................................ 2001-245190

(51) Int. Cl.⁷ ............................... G11C 8/00; G11C 7/00
(52) U.S. Cl. .............. 365/233; 365/189.04; 365/230.01
(58) Field of Search .................................. 365/233, 241, 365/230.01, 189.04, 189.07, 194

(56) References Cited

U.S. PATENT DOCUMENTS 5,517,631 A  * 5/1996 Machado et al. ........... 395/438

FOREIGN PATENT DOCUMENTS

| JP | 5268201 | 10/1993 |
| JP | 9055723 | 2/1997 |

* cited by examiner

Primary Examiner—Thong Quoc Le
(74) Attorney, Agent, or Firm—Rabin & Berdo, P.C.

(57) ABSTRACT

Clock switching circuitry includes a memory having a plurality of storage locations of a particular address each and configured to allow data to be written in and read out at the same time. The circuitry further includes a write pointer, a read pointer, a synchronizing circuit, a conflict detector, and a conflict avoiding circuit. The circuitry detects a conflict with high reliability and facilitates design using a CAD (Computer Aided Design) tool.

7 Claims, 12 Drawing Sheets

CLOCK SWITCHING CIRCUITRY FOR AVOIDING CONFLICT OF DATA HANDLING OCCURING IN A MEMORY

BACKGROUND OF THE INVENTION

1. Field of the Invention

The present invention relates to clock switching circuitry applicable to, e.g., a bit synchronizing circuit for a high-speed transmission interface for receiving input data timed with one clock and developing the input data in synchronized with another clock different in phase from the one clock.

2. Description of the Background Art

Clock switching circuitry is disclosed in, e.g., Japanese patent laid-open publication No. 268201/1993 (Document 1 hereinafter) and Japanese Patent No. 3119793. The circuitry taught in Document 1 includes a plurality of memories. When writing the memories, input data are written into the memories in timed with a write clock while sequentially switching the memories frame by frame of the input data. On the other hand, when reading the memories a read clock is supplied to read out the data from the memories while sequentially switching the memories frame by frame. As a result, the data are transferred from the write clock to the read clock.

The circuitry of Document 1 includes a phase monitor and a phase controller. The phase monitor detects a conflict occurring between the write phase and the read phase in the same memory. When the phase monitor detects a conflict, the phase controller varies the read phase and thereby sets up a preselected phase difference between the write phase and the read phase. It is to be noted that a conflict refers to, e.g., an occurrence that data writing and data reading of the same storage location of an address occur at the same time. A conflict causes data, while being written into the storage location, to be read out halfway, resulting in incorrect data. It is therefore necessary to surely detect a conflict and prevent it from repeating. With the above configuration, the circuitry of Document 1 can switch the clock without resorting to a digital-to-analog converter and an analog-to-digital converter heretofore essential for clock switching.

However, the circuitry of Document 1 has some problems left unsolved, as will be described hereinafter. The write clock dominating the write phase in an address space and the read clock dominating the read phase out of the address space are not synchronous to each other, i.e., not always coincident in phase with each other. Moreover, to detect a conflict, the phase monitor compares the phase of a write window pulse derived from the asynchronous write phase with the phase of a read pulse, i.e., produces an AND of the two pulses. This kind of scheme fails to surely detect a conflict itself.

For example, assume that the phase monitor determines that a conflict has occurred when the high level of the write window pulse and that of the read pulse overlap each other. Then, the duration of the overlap is likely to be extremely short, e.g., shorter than the duration of a single clock pulse because the two pulses are not synchronous to each other. Generally, the above duration may even be shorter than a period of time necessary for a flip-flop or a latch to be set up and hold data. In such a case, correctness of data held in the flip-flop or the latch cannot be guaranteed, resulting in low reliability.

On the other hand, a CAD (Computer Aided Design) tool may often be used to design the clock switching circuitry in the same manner as to design electronic circuits in general. In this respect, the write window pulse and read pulse not synchronous to each other prevent a simple software macro-function, which can work sufficiently only by specifying functions of a clock switching circuitry, from being used with the CAD tool. Therefore, to design a clock switching circuit, use must be made of a hardware macro-function for specifying even the layout of the individual circuit devices in detail. It makes design work difficult to perform.

SUMMARY OF THE INVENTION

It is an object of the present invention to provide clock switching circuitry capable of detecting a conflict with high reliability and facilitating design work using a CAD tool.

Clock switching circuitry of the present invention includes a memory having a plurality of storage locations of a particular address each. The memory allows data to be written into and read out from each storage location at the same time. A write pointer causes a write address addressing a storage location to vary in synchronism with a write clock. A read pointer causes a read address addressing a storage location to vary in synchronism with a read clock. A synchronizer selectively executes first synchronization for synchronizing the phase of the write address with the read clock to generate a synchronized write address or second synchronization for synchronizing the phase of the read address with the write clock to generate a synchronized read address. A conflict detector outputs an alarm signal when determining that a phase difference between the write address and the synchronized read address is smaller than a preselected reference value or that a phase difference between the read address and the synchronized write address is smaller than the preselected reference value. A conflict avoiding circuit executes, in response to the alarm signal, a conflict avoiding operation that causes the write address and read address to differ form each other by at least the reference value.

BRIEF DESCRIPTION OF THE DRAWINGS

The objects and features of the present invention will become more apparent from consideration of the following detailed description taken in conjunction with the accompanying drawings in which.

DESCRIPTION OF THE PREFERRED EMBODIMENTS

Figure 1:
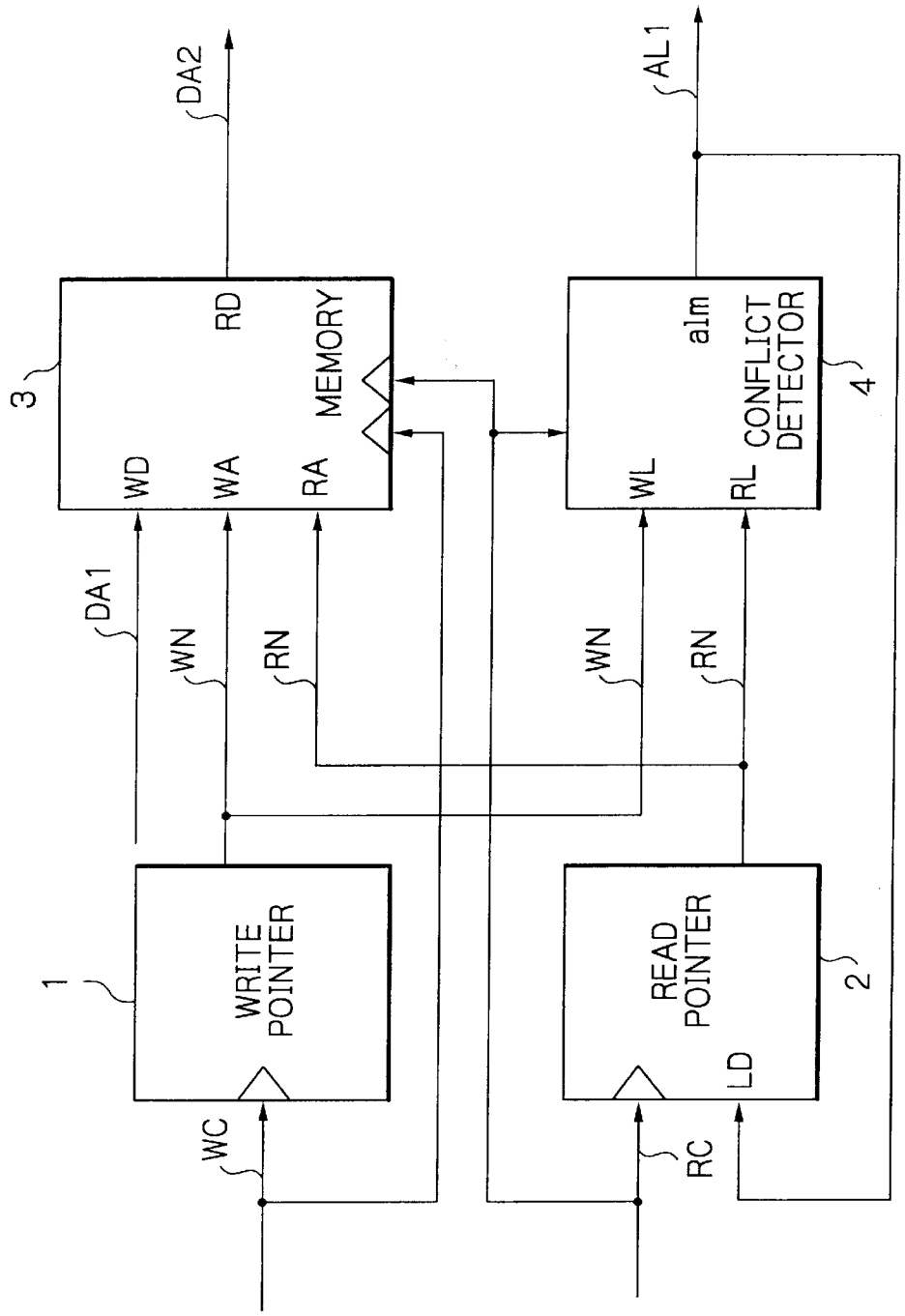
FIG. 1 is a schematic block diagram showing essential part of a bit synchronizing circuit to which a first and a second embodiment of the clock synchronizing circuit in accordance with the present invention are applied.

Referring to FIG. 1 of the drawings, a bit synchronizing circuit for a high-speed transmission interface to which an embodiment of the clock switching circuitry in accordance with the present invention is applied is generally made up of a write pointer 1, a read pointer 2, a memory 3, and a conflict detector 4.

The memory 3 is adapted to allow data to be written in and read out therefrom at the same time. A write address value WN and a read address value RN are fed to the memory 3 independently of each other. The write address value WN and read address value RN respectively address a storage location to which data should be written in and a storage location from which data should be read out. When a certain storage location is addressed by the write address value WN, data DA1 coming from a high-speed communication or transmission path, e.g., speech data is written into the addressed storage location. When a certain storage location is addressed by the read address value RN, data DA2 is readout from the addressed storage location and delivered to the succeeding stage, not shown, of the bit synchronizing circuit.

More specifically, the memory 3 receives the write address value WN and read address value RN via address input terminals WA and RA, respectively. Also, the memory 3 receives the data DA1 via a data input terminal WD and delivers the data DA2 via a data output terminal RD.

A write clock WC and a read clock RC are input to the clock input terminal of the write pointer 1 and the clock input terminal of the read pointer 1, respectively. The write pointer 1 feeds the address value WN to the memory 3 at the positive-going edge of the clock WC. Likewise, the read pointer 2 feeds the address value RN to the memory 3 at the positive-going edge of the clock RC. Therefore, the data DA1 is written into the memory 3 in synchronism with the write clock WC while the data DA2 is read out from the memory 3 in synchronism with the clock RC.

The address space of the memory 3 addressed by the write address value WN or the read address value RN may have any desired size. In practice, the address space should preferably be as small as possible for saving memory capacity as well as for other purposes. In the illustrative embodiment, the address space is assumed to have a size m of "8" corresponding to the length of a clock switching frame. It follows that an integer represented by the write address value WN or the read address RN value takes any one of "0" to "7". It is to be noted that the storage locations of the memory 3 and the word length may have any desired size.

The write pointer 1 is a free-running counter that cyclically counts the pulses of the input write clock WC in a preselected range between the upper limit and the lower limit. In the illustrative embodiment, the preselected range is from "0" to "7" corresponding to the size m of the address space of the memory 3. More specifically, in response to every positive-going edge of the write clock WC, the write pointer 1 cyclically varies, or increments in the illustrative embodiment, its count from "0" to "7" and again from "0" to "7". The count of the write pointer 1 is directly input to the memory 3 as the write address value WN.

The read pointer 2 clocked by the read clock RC is identical in configuration with the write pointer 1 except for the following. When the conflict detector 4 generates an alarm signal AL1 and feeds it to the read pointer 2, the read pointer 2 is loaded with the alarm signal AL1 via a load terminal LD. The read pointer 2 then causes its count to jump from the current value, as will be described in detail later.

The write clock WC and read clock RC may be provided with the same clock period or pulse interval as each other. This allows the bit synchronizing circuit to be initialized to start operating with as great a phase difference as possible being provided between the write address value WN and the read address value RN. For example, when the size m of the address space of the memory 3 is "8", the maximum phase difference is "4" in terms of the address value. In practice, however, the clock interval of the write clock WC, which is obtained from the high-speed transmission interface, is likely to dynamically vary due to, e.g., jitter and wonder particular to the communication or speech path, resulting in a conflict between read and write.

Figure 2:
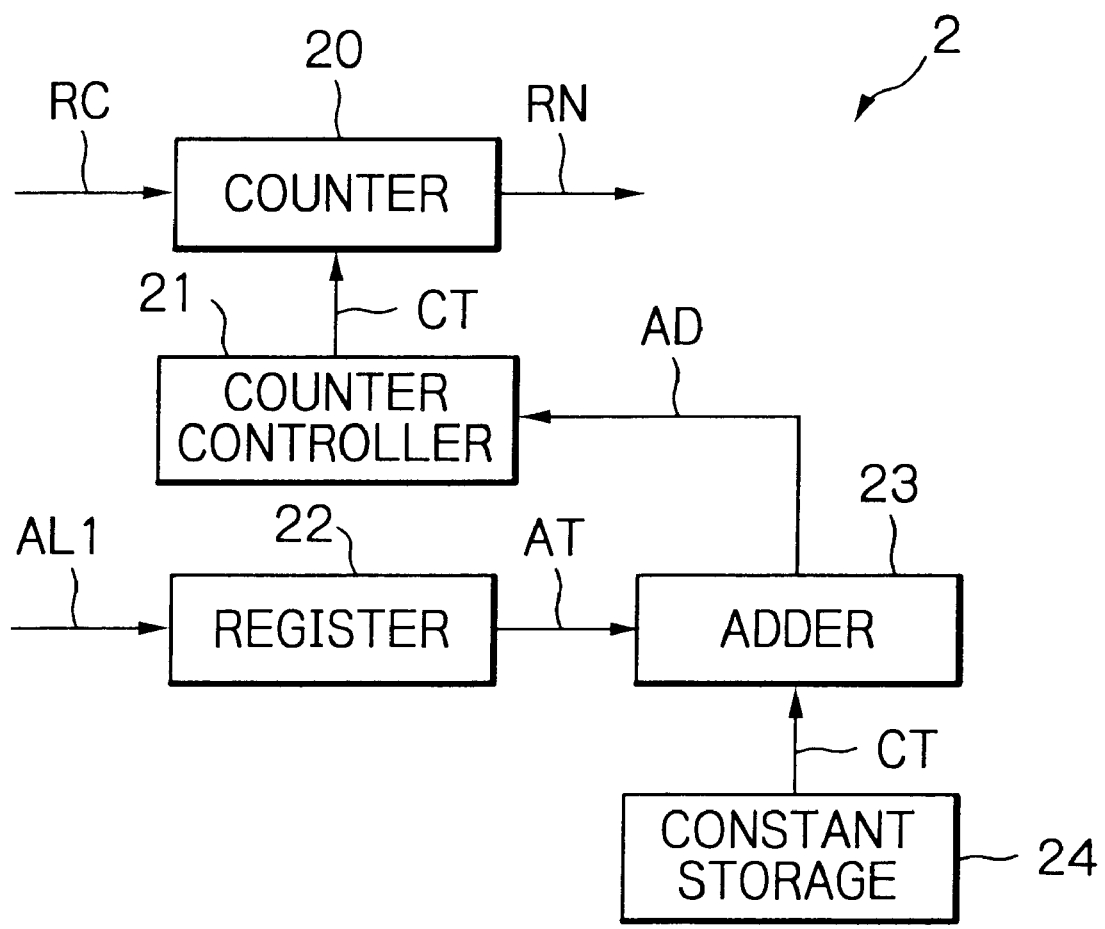
FIG. 2 is a schematic block diagram showing a specific configuration of a read pointer included in each of the first and second embodiments.

FIG. 2 shows a specific configuration of the read pointer 2 configured to cope with a conflict. As shown, the read pointer 2 includes a counter 20, a counter controller 21, a register 22, an adder 23, and a constant storage 24. The counter 20 is a free-running counter that generates the read address value RN. Usually, the counter 20 increments its count from "0" to "7" and then returns it to "0", as stated earlier. However, when the counter controller 21 feeds a count control signal CT to the counter 20, the counter 20 causes its count, i.e., the read address value RN to jump accordingly.

The register 22 is adapted to store the alarm signal AL1 received from the conflict detector 4. More specifically, the alarm signal AL1 contains a write address value WN having appeared when the conflict detector 4 has detected a conflict. The register 22 stores the write address value WN for a moment while feeding it to the adder 23 as a signal AT.

The adder 23 receives a constant from the constant storage 24 as the signal CT in addition to the signal AT. The adder 23 is adapted to add the values represented by the signals AT and CT and output the resulting sum as a signal AD. More specifically, the constant storage 24 is adapted to store a constant that is equal to one-half of the size m of the address space of the memory 3; in the illustrative embodiment, the constant is "4" that is one-half of m=8. When the sum AD exceeds "7", the adder 23 selects one of "0" through "8" corresponding to the excess as the sum AD; when the sum AD exceeds "7" the adder 23 selects one of "0" through "3". For example, when a conflict occurs in the phase of the address value "6", the signal AT is representative of "6", so that the sum AD is "2 (=6+4−8)".

The constant added to the address value coincident with the conflict is "4" that is equal to one-half of the size "8" of the address space, as stated above. As a result, the phase of the write address value WN and that of the read address value RN are farthest from each other; that is, the frame phases are remote from each other by 180°. This minimizes the probability that a conflict occurs at the time of successive writing or reading. Generally, the size m of the address space does not have to be "8" or similar even number. When an odd number is selected, how the count jumps in the event of a conflict should only be determined beforehand. For example, when the size m is "9", it may be determined beforehand that the count jumps by four or five at the time of a conflict.

The address value coincident with a conflict is the same as the address value having occurred just before the address value RN currently output from the counter 20. Therefore, if the read pointer 2 additionally includes means for storing the address value having occurred just before the current address value RN, then the alarm signal AL1 may not be adapted to contain the address value WN, but should be adapted only to report the occurrence of a conflict. In such a case, the read pointer 2 will output a sum of the previous address value and "4" as the next address value RN.

When the count jumps in the event of a conflict, the data DA2 stored in the memory 3 are read out in an order different from the original order. However, the rearrangement of the data DA2 is effected by the communication protocol function of an upper layer.

Referring again to FIG. 1, the conflict detector 4 is interconnected to receive the read clock RC on its clock input terminal, the write address value WN on its address input terminal WL, and the read address value on its address input terminal RL. Also, the conflict detector 4 is adapted to output the alarm signal AL1 on its alarm output terminal aim. The conflict detector 4 is the major component that causes the read address value RN to jump, i.e., implements a self-resetting function.

The conflict detector 4 clocked by the read clock RC may be adapted to directly compare the phase of the read address value RN with that of the write address value WN for detecting a conflict. In the illustrative embodiment, however, the conflict detector 4 detects a conflict with the following unique scheme. Assume that the minimum period of time necessary for the detection of a conflict is one period of the read clock RC, i.e., n=1, where n corresponds to the duration of one clock pulse. Then, the conflict detector 4 generates a write window pulse signal WP (see FIG. 3, line (f)) whose active level (high level) has a duration of n+1. Subsequently, the conflict detector 4 compares the phase of the pulse signal WP with that of a read pulse signal RP (see FIG. 3, line (g)) having a duration of n=1 corresponding to the read address value RN.

Whenever a conflict occurs, the high level of the write pulse signal WP widened as above and that of the read pulse signal RP are apt to overlap each other over a long period of time. This successfully increases the possibility of conflict detection.

The high level of the write window pulse WP has the duration of n+1, as stated above. Therefore, the conflict detector 4 is also apt to erroneously determine that a conflict has occurred despite that it has not occurred. It is to be noted that a conflict refers to the simultaneous occurrence of writing and reading the same storage location of an address. For example, assume that the high level of the write window pulse WP extends to the phase of the address value "6", even when the write address value WN is "5" and the read address value RN is "6". Then, the conflict detector 4 may determine that a conflict has occurred erroneously. However, when the write address value WN and read address value RN are so close to each other as above, it is rather desirable from the reliability standpoint to determine that a conflict has occurred and to cause the read address value RN to jump accordingly.

The write window pulse signal WP is derived from the write address value WN and therefore is synchronous in phase to the write clock WC, i.e., not synchronous to the read clock RC. It is therefore preferable to switch or shift the clock such that the write window pulse signal WP is synchronous to the read clock RC. The clock switching operation is equivalent to producing a pulse signal (f) shown in FIG. 4 from a pulse signal (e) also shown in FIG. 4. Such clock switching further enhances reliable conflict detection.

Figure 5:
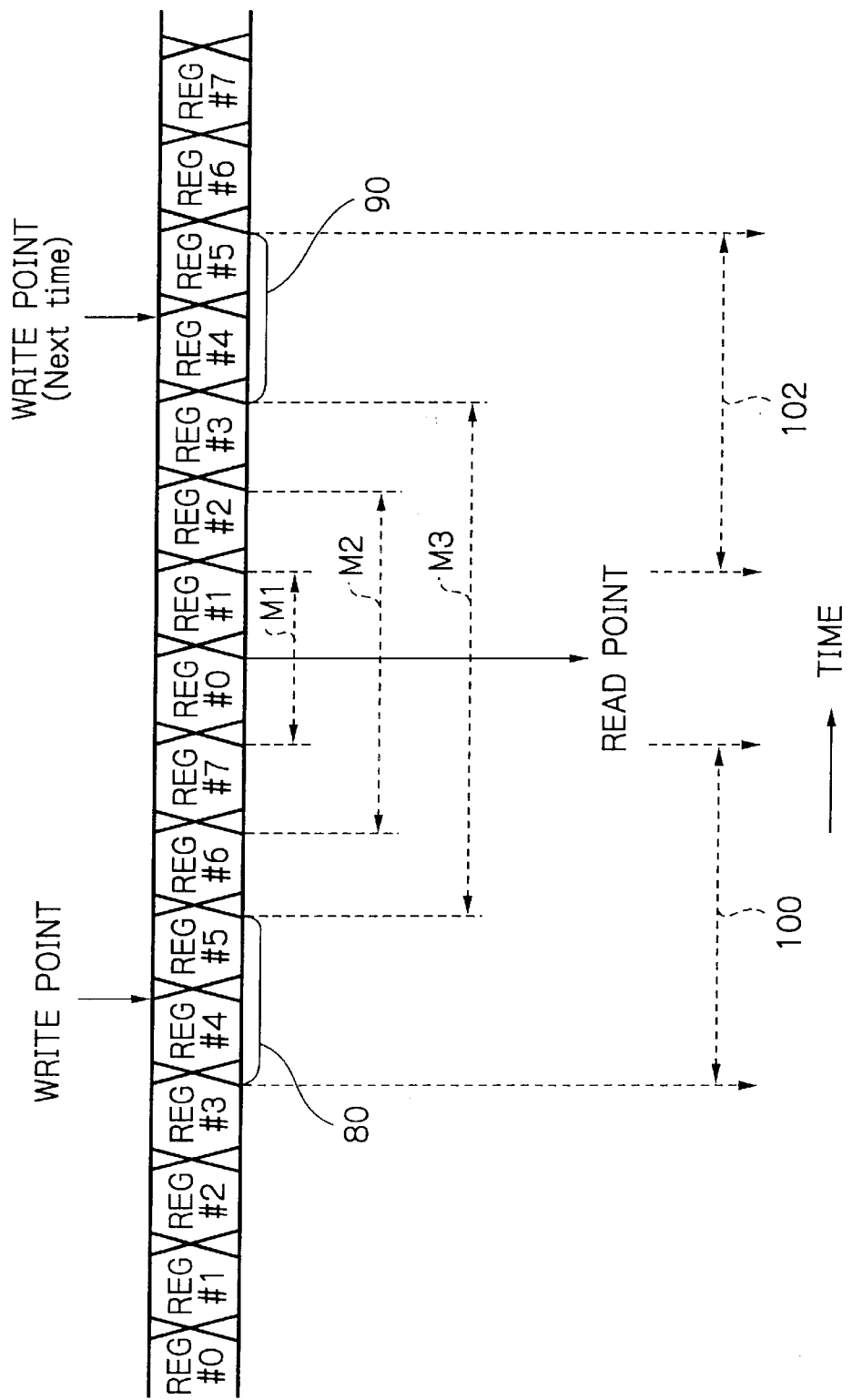
FIG. 5 is a timing chart useful for understanding the operations of the first and second embodiments as well as the operation of a third embodiment.

Why the illustrative embodiment selects "8" as the size m of the address space of the memory 3 will be described with reference to FIG. 5. In FIG. 5, REG #1 through REG #7 are representative of the storage locations of the memory 3; integers 1 through 7 correspond to the address values of the memory 3. FIG. 5 shows a specific condition in which data is read out from the storage location REG #0 where the read address value RN (READ POINT) is addressing, and data is written into the storage location REG #4 where the write address value WN (WRITE POINT) is addressing.

The memory 3 allows data to be written in and read out therefrom at the same time, as stated previously. Therefore, at least two storage locations are necessary for switching the clock for the data DA1 and DA2, so that a phase difference M1 necessary for switching the clock is plus and minus one clock pulse duration, i.e., two clock pulse durations. To absorb plus and minus one bit of jitter, i.e., 2k clock periods of jitter (k=1) particular to the transmission interface while effecting clock switching, 2k storage locations are necessary. Therefore, the sum M2 of necessary storage locations is four (=2+2k).

Further, when the count jumps, i.e., when the read address value RN is reset, resetting may not be synchronous to the clock (read clock RC). To absorb such asynchronism, two storage locations are required that correspond to a phase difference of plus and minus one clock pulse duration necessary for allowing the phase limitation on the resetting and clock to be canceled. Therefore, the sum M3 of necessary storage locations is six. Moreover, when the count jumps, two additional storage locations are necessary because a conflict detection range 80 or 90 is equal to the duration of two clock periods corresponding to the duration of two clock pulses (=n+1 where n is 1) of the high level of the write window pulse signal WP. Consequently, eight storage locations are required in total.

A specific operation of the illustrative embodiment to occur when a conflict is absent will be described with reference to FIG. 3. As shown, the size m of address space of the memory 3 is "8" while a phase difference n necessary for conflict detection is 1, as stated earlier. Also, the initial value of the write address value WN and that of the read address value RN are assumed to be "0" and "4", respectively.

Figure 3:
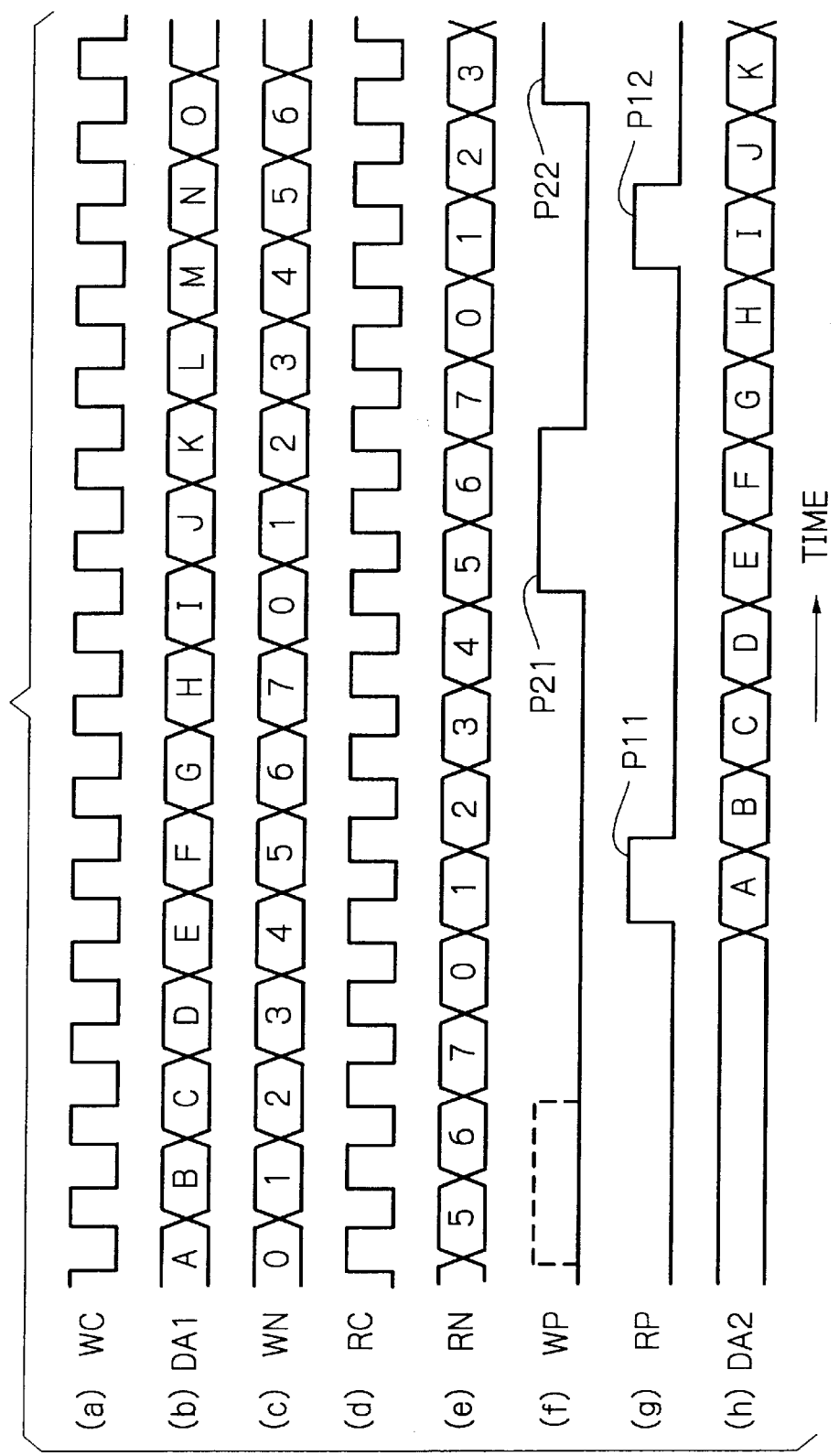
FIG. 3 is a timing chart demonstrating a specific operation of the first embodiment.

Input data DA1 shown in FIG. 3, line (b), are synchronous to the write clock WC shown in FIG. 3, line (a). The write pointer 1 designates the consecutive write address values WN shown in FIG. 3, line (c), in synchronism with the write clock WC. The input data DA1 are therefore sequentially written into the storage locations of the memory 3 addressed by the write address values WN. At the same time, the read pointer 2 addresses the consecutive storage locations associated with the read address values RN shown in FIG. 3, line (e), in synchronism with the read clock RC shown in FIG. 3, line (d). Therefore, output data DA2 shown in FIG. 3, line (h), are sequentially readout from the storage locations addressed by the read address values RN. Just after the bit synchronizing circuit has started operating, effective input data DA1 are not yet stored in the memory 3; as shown in FIG. 3, line (h), the first effective data DA2 is read out after the elapse of five clock periods.

Assume that "A" through "H" of the input data DA1 are sequentially written into the storage locations addressed by the write address values "0" through "7", respectively. Then, the data "A" through "H" are sequentially read out from the storage locations addressed by the read address values RN "0" through "7", respectively, as the data DA2.

After the data "H" has been written into the storage location addressed by the write address value WN "7", the ninth input data "I" is written into the storage location again addressed by the write address value WN "0" as the input data DA1. It is to be noted that the input data "A" has been read out from the above storage location. Thereafter, the tenth input data DA1 "J" and successive input data are sequentially written into the storage locations in the same manner. Therefore, when the read address value RN again designates "0", not the previous data "A", but the ninth data "I" is read out as the output data DA2. This is also true with the tenth data "J" and successive data.

FIG. 3, line (g) shows the read pulse signal RP including its high levels P11 and P12. The high level P11 appears in the phase where the data begin to be read out, i.e., where the read address value RN designates the first "0". The high level P12 following the high level P11 appears in the phase where the read address value RN designates the second "0". FIG. 3, line (f), shows the write window pulse signal WP having its high levels P21 and P22. The high level P21 appears in the phase where the write address value WN designates the second "4" and "5". The high level P22 following the high level P21 appears in the phase where the write address value WN designates the third "4" and "5". The write window pulse signal WP may additionally remain in its high level in the phase where the write address value WN designates the first "4" and "5", as indicated by a dotted line in FIG. 3, line (f). In this phase, however, reading-out of data from the memory 3 has not begun yet, so that a conflict does not occur. The additional high level is therefore omitted.

The bit synchronizing circuit repeats the operation described above in the ideal condition in which neither the influence of jitter nor a conflict occurs. In this case, the phase of the write address value WN and that of the read address value RN are farthest from each other. More specifically, the frame phases are remote from each other by 180°, i.e., the address values are remote from each other by four.

Assume that the interval between, e.g., the input data DA1 "J" and "K" becomes longer than usual due to the influence of jitter. Then, the interval between the pulses of the write clock WC also extends at the above interval. As a result, the counting rate of the write pointer 1 is lowered with the result that the writing-in of the data "K" to the storage location addressed by the write address value WN "2" is delayed. On the other hand, because the read clock RC is free from the influence of the jitter, the phase of the read address value RN is advanced relative to the phase of the write address value WN by the delay of the write address value WN. If the delay ascribable to jitter is not longer than a period of time corresponding to a single clock period, then the phase of the read address value RN is advanced by a unit address relative to the phase of the write address value WN.

In the condition stated above, the phase of the write address value WN (FIG. 3, line (c)) is shifted to the right by a single clock period together with the write clock WC (FIG. 3, line (a)) and input data DA1 (FIG. 3, line (b)). As a result, the minimum phase difference decreases from four to three. Consequently, the phase of the write window pulse signal WP (FIG. 3, line (f)) is also shifted to the right by a single clock period. The remaining part of the operation is repeated as usual, i.e., in the same manner as before jitter has occurred. The data DA2 are therefore accurately read out at the expected intervals. In this manner, clock switching based on writing-in of the data DA1 to the memory 3 and reading-out of the data DA2 from the memory 3 successfully absorbs the influence of jitter if the duration of the jitter is plus and minus one bit duration or less.

In the illustrative embodiment, the address space is sized to cope with jitter only of plus and minus one bit or less shown in FIG. 5. Therefore jitter of two or more bits, i.e., jitter of two or more clock periods are likely to affect clock switching and other operations. For example, assume that such jitter delays the phase of the write address value WN by four bits, i.e., by four clock periods of the read clock RC. Then, the read address value RN originally remote from the write address value WN by four addresses catches up with the write address value WN, tending to cause the same input data DA1 to be read out duplicate times.

Conversely, when the write address value is advanced due to the jitter, it catches up with the read address value RN and tends to cause new input data DA1 to be written over the existing data DA1, i.e., data DA2.

Assume that the phase difference between the read address value RN and the write address value WN tends to decrease due to jitter, as stated above. Then, in the illustrative embodiment, the conflict detector 4 detects a conflict and causes the read address value RN to jump. However, such a jump, labeled 100 or 102 in FIG. 5, prevents data from being read out or written in only from or to the storage location which is now written or read, respectively. Therefore, to surely prevent the same input data DA1 from being read out duplicate times from a storage location other than one where a conflict is detected or to prevent new input data DA1 from being written over the data DA1 still present in such a storage location, i.e., data DA2, it is necessary to provide the memory 3 with a greater storage space.

So long as the jitter has a duration of plus and minus one bits or less, the illustrative embodiment with the address space having the size m of "8" can switch the clock for the data DA1 and DA2 and can therefore absorb jitter. In addition, the illustrative embodiment can cause the read address value RN to jump when a conflict is detected. The jump 100 or 102, FIG. 5, provides a phase difference of four addresses between the write address value WN and the read address value RN. As a result, there is restored the condition that minimizes the possibility of a conflict ascribable to jitter.

As stated above, the illustrative embodiment produces the write window pulse signal WP from the write clock WC that is not always synchronous to the read clock RC. The illustrative embodiment can detect a conflict by switching the clock from the write clock WC to the read clock RC. Therefore, in the event of a conflict, the duration of the high level of the write window pulse signal WP and the duration of the high level of the read pulse signal RP overlap each other over a sufficiently long period of time. This implements sure conflict detection and thereby enhances reliable operation. Moreover, when a CAD tool is used to design the bit synchronizing circuit, the illustrative embodiment allows a simple, software macro-function to be used which is capable of functioning only by specifying functions of a circuit. This makes design work easier to perform.

Figure 6:
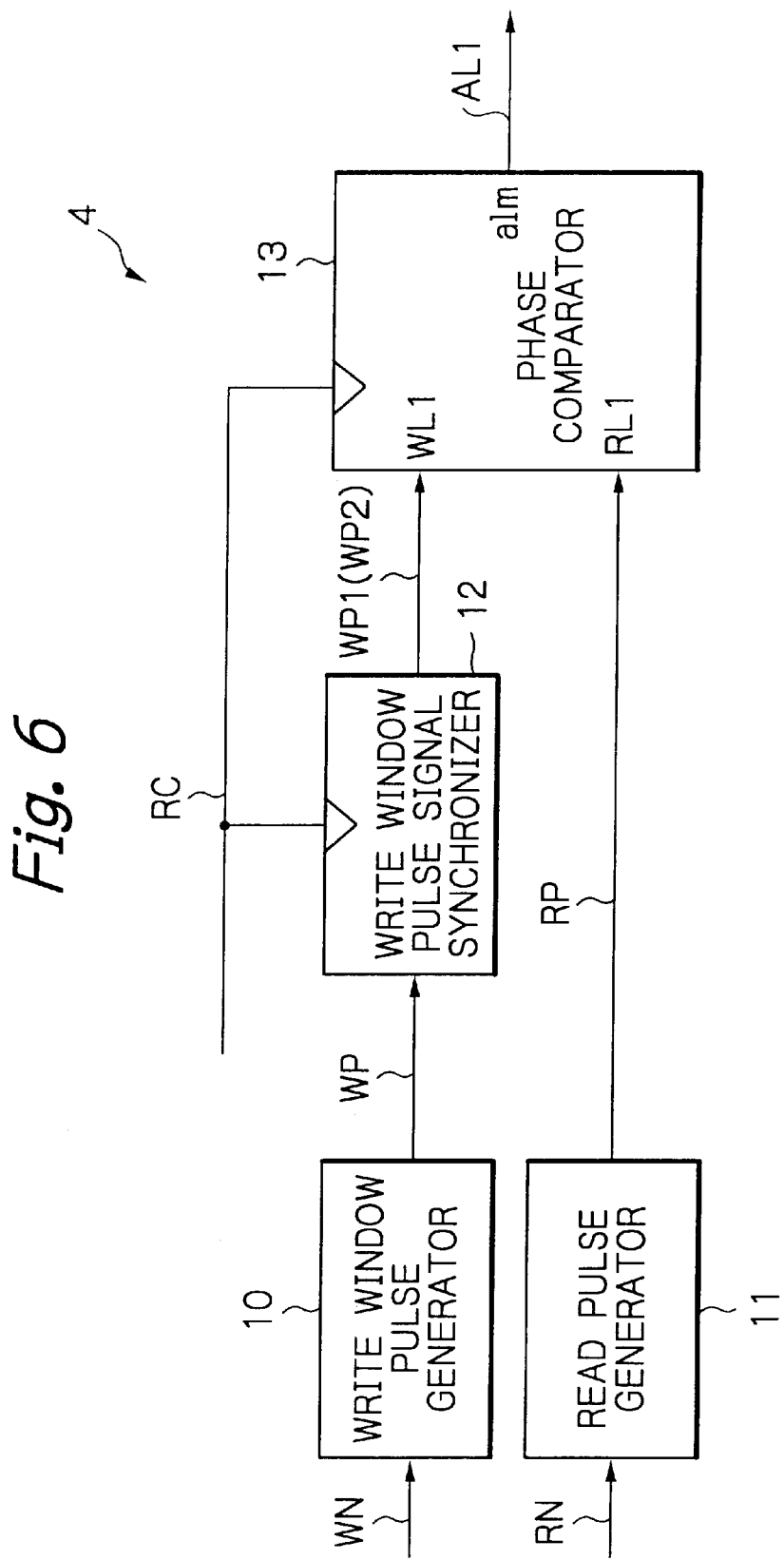
FIG. 6 is a schematic block diagram showing a specific configuration of a conflict detector particular to the second embodiment.

A second embodiment of the clock switching circuitry in accordance with the present invention will be described hereinafter. The following description will concentrate on differences between the first embodiment and the second embodiment. FIG. 6 shows a specific configuration of the conflict detector 4, which may not be clearly indicated in the first embodiment. As for the rest of the configuration, the second embodiment is identical with the first embodiment. That is, the write pointer 1, read pointer 2 and memory 3 also exist in the second embodiment and operate in the same manner as in the first embodiment. This is also true with the connection of the write pointer 1, read pointer 2 and memory 3 to the conflict detector 4.

As shown in FIG. 6, the conflict detector 4 includes a write window pulse generator 10, a read pulse generator 11, a write window pulse signal synchronizer 12, and a phase comparator 13. Receiving the write address value WN from the write pointer 1, the write window pulse generator 10 generates the write window pulse signal WP whose high level has the duration of n+1. The phase of the write window pulse signal WP is not synchronous to the phase of the read clock RC, but is synchronous to the phase of the write clock WC corresponding to the phase of the write address value WN, as stated earlier.

The write window pulse signal synchronizer 12 operates in synchronism with the positive-going edges of the read clock RC. The synchronizer 12 therefore synchronizes the write window pulse signal WP with the read clock RC, thereby switching the clock. This clock switching operation is equivalent to the operation for producing a write window pulse signal WP1 (FIG. 4, line (f) or FIG. 7, line (f)) from the write window pulse signal WP (FIG. 4, line (e) or FIG. 7, line (e)). The synchronizer 12 may be implemented by a single D-FF (D type of flip-flop) or two cascaded D-FFs. As for the two cascaded D-FFs, the Q output terminal of the preceding D-FF is connected to the D input terminal of the following D-FF.

Receiving the read address value RN from the read pointer 2, the read pulse generator 11 generates the read pulse signal RP whose high level has the duration of n. Because the read address value RN is synchronous to the read clock RC, the read pulse signal is, of course, synchronous to the read clock RC.

The phase comparator 13 receives the write window pulse signal WP1 switched in clock from the write window pulse signal synchronizer 12 and receives the read pulse signal RP from the read pulse generator 11. The phase comparator 13 compares the phases of the two signals WP1 and RP to thereby determine whether or not a conflict has occurred. If the signals WP1 and RP compare equal in phase, i.e., if the high levels of the signals WP1 and RP overlap each other with respect to time, then the phase comparator 13 determines that a conflict has occurred. If the high levels of the signals WP1 and RP do not overlap each other, then the phase comparator 13 determines that a conflict has not occurred. It is noteworthy that the read pulse signal RP and write window pulse signal WP1 are synchronous to each other because of clock switching, enhancing reliable conflict detection.

Figure 4:
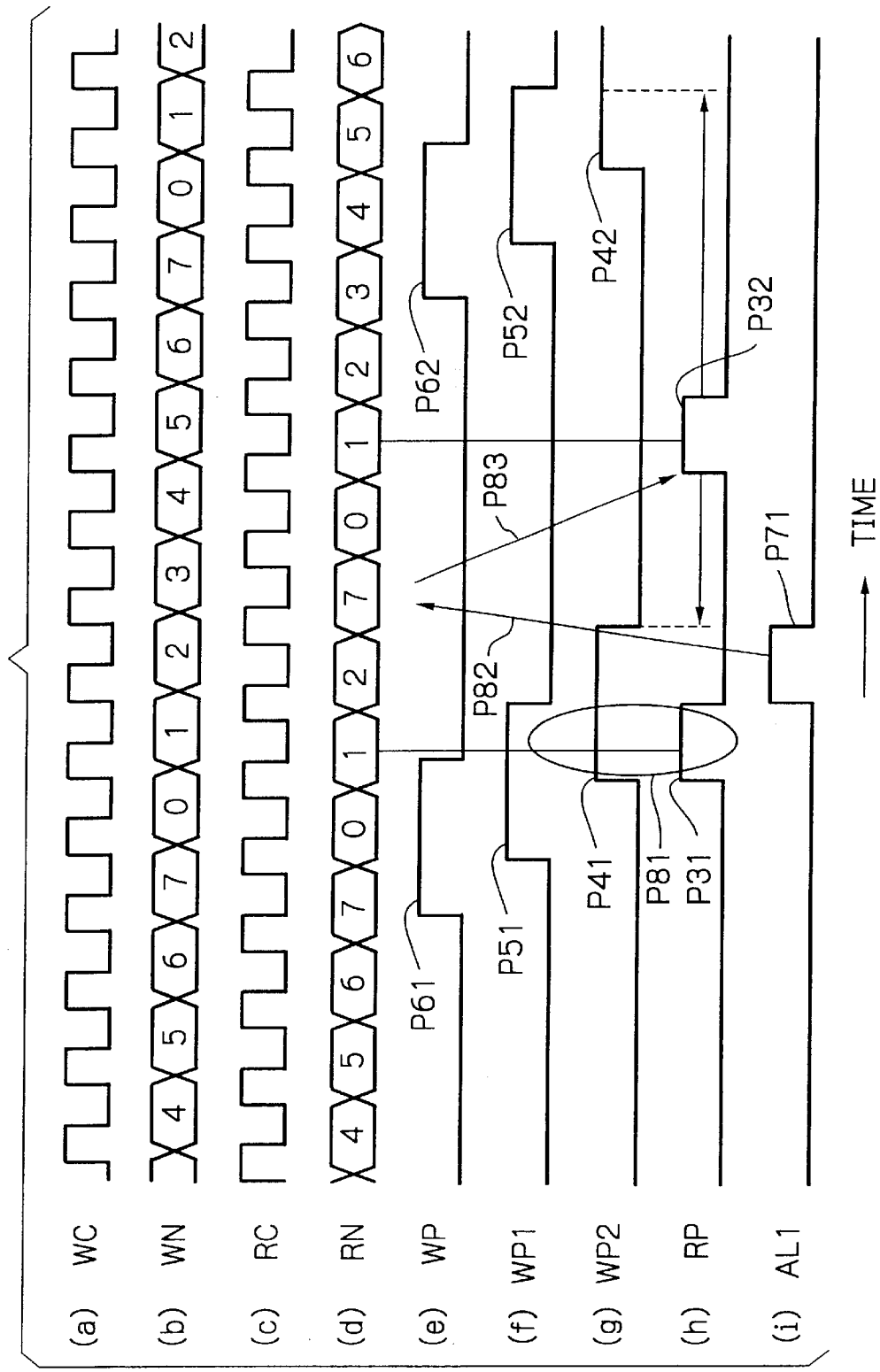
FIG. 4 is a timing chart demonstrating a specific operation of the second embodiment.

The phase comparator 13 is more reliable than conventional even if it is configured to directly compare the phase of the read pulse signal RP and that of the write window pulse signal WP1. Further, the illustrative embodiment shifts the write window pulse signal WP1 by one bit in order to obviate the influence of meta-stability, as shown in FIG. 4, line (g) or 7, (g). Why the signal WP1 is shifted by one bit is that a D-FF, for example, is included in the phase comparator 13 against meta-stability and brings about a delay corresponding to one clock period of the read clock RC. However, this shift is not necessary when the write window pulse synchronizer 12 is implemented by two cascaded D-FFs, because the synchronizer 12 will output WP2 in place of WP1. In such a case, the phase comparator 13 may be implemented by an AND gate.

Because the write clock WC is obtained from the external high-speed transmission interface, a conflict is always ascribable to the jitter and so forth on the transmission interface, i.e., the write clock WC. Jitter, for example, occurs in both of the directions in which the clock period of the write clock WC decreases and increases. For example, assume high levels P31 and S32 included in the read pulse signal RP shown in FIG. 4, line (h), or FIG. 7, line (h). Then, a conflict occurs when the high level of the write window pulse signal WP2 overlaps the high level P31 from the front (rightward) or overlaps the high level S32 from the rear (leftward).

The conflict from the front occurs when the rate of change of the write address value WN decreases with the result that the read address value RN changing at the expected rate catches up with the write address value WN. The conflict from the rear occurs when the rate of change of the write address value WN increases and catches up with the read address value RN changing at the expected rate.

More specifically, in FIG. 4, lines (g) and (h), a high level P41 included in the right window pulse WP2 conflicts with the high level P31 of the read pulse signal RP from the front (conflict P81). If this phase relation continues, then another conflict is likely to occur in the phase of the next high level P42 as well. In light of this, the phase comparator 13, which detected the conflict P81, outputs the alarm signal AL1 (alarm P71), causing the read pointer or read address value RN to jump, as indicated by an arrow P82. Consequently, the read address value RN jumps from "2" to "7" and causes the high level P32 of the read pulse signal RP to occur next, as indicated by an arrow P83. This prevents the conflict from repeating.

Figure 7:
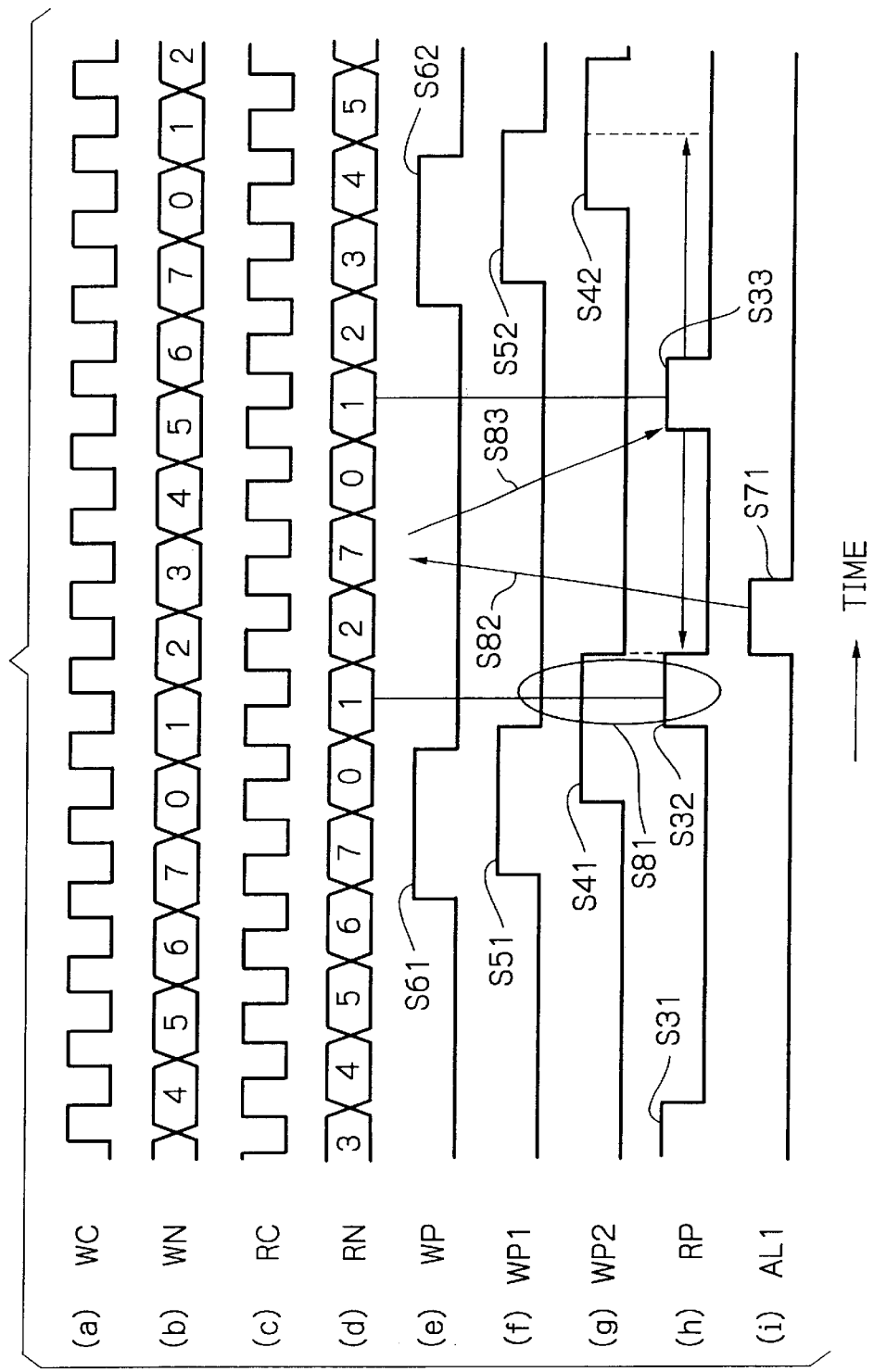
FIG. 7 is a timing chart also showing a specific operation of the second embodiment.

Likewise, in FIG. 7, lines (g) and (h), the high level S41 of the write window pulse WP2 conflicts with the high level S32 of the read pulse signal RP from the rear (conflict S81) Therefore, the phase comparator 13, which detected the conflict S81, outputs the alarm signal AL1 (alarm S71), causing the read pointer to make the read address value RN to jump, as indicated by the arrow S82. Consequently, the read address value RN transfers from "2" to "7" and causes the high level S33 of the read pulse signal RP to occur next, as indicated by the arrow S83. This also prevents the conflict from repeating.

As stated above, the illustrative embodiment shifts the write window pulse signal by one bit duration after clock switching and thereby surely obviates meta-stability, which lowers reliability. The illustrative embodiment, of course, achieves the advantages described in relation to the previous embodiment as well.

Figure 8:
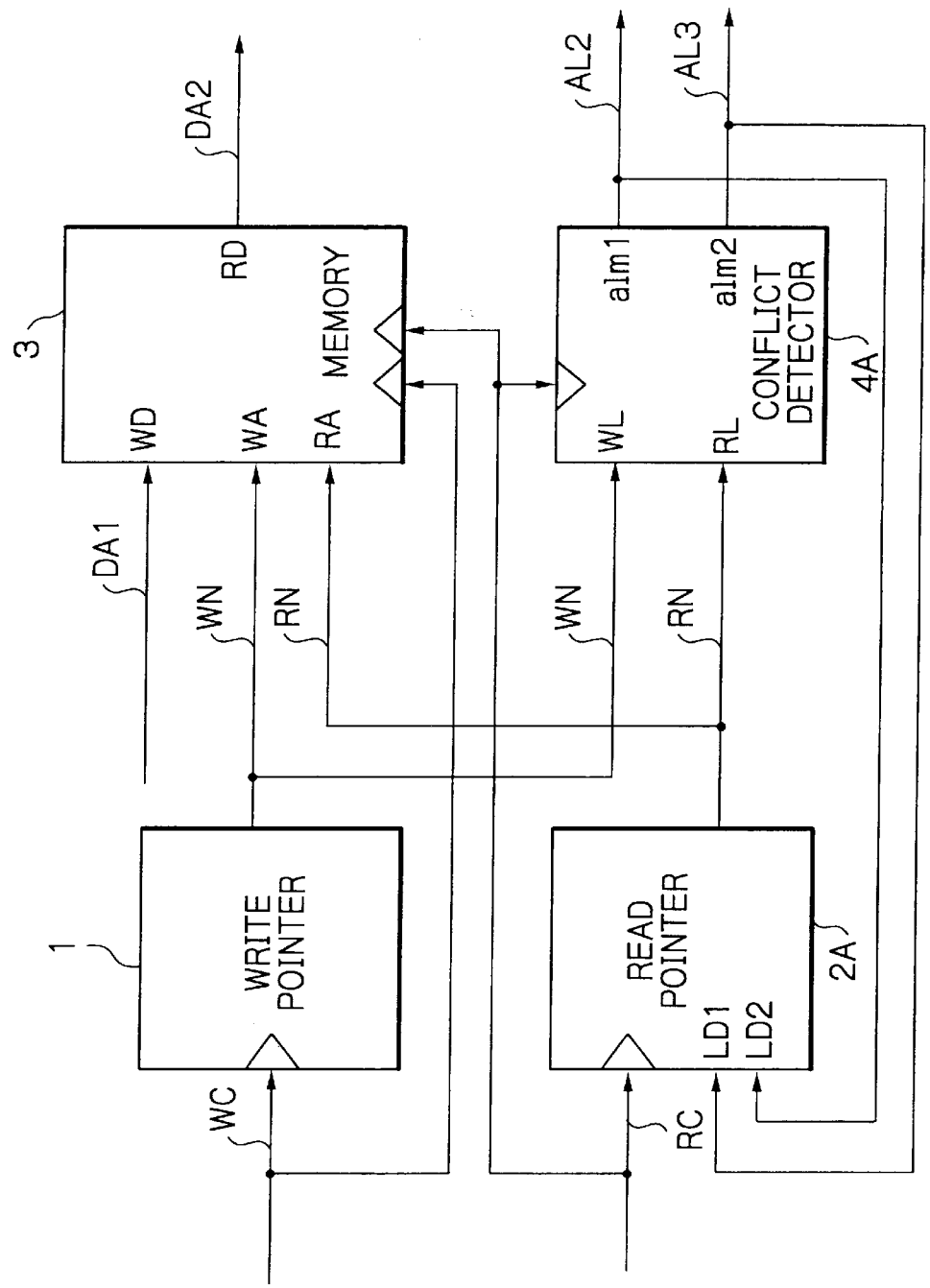
FIG. 8 is a schematic block diagram showing the third embodiment of the present invention.
Figure 9:
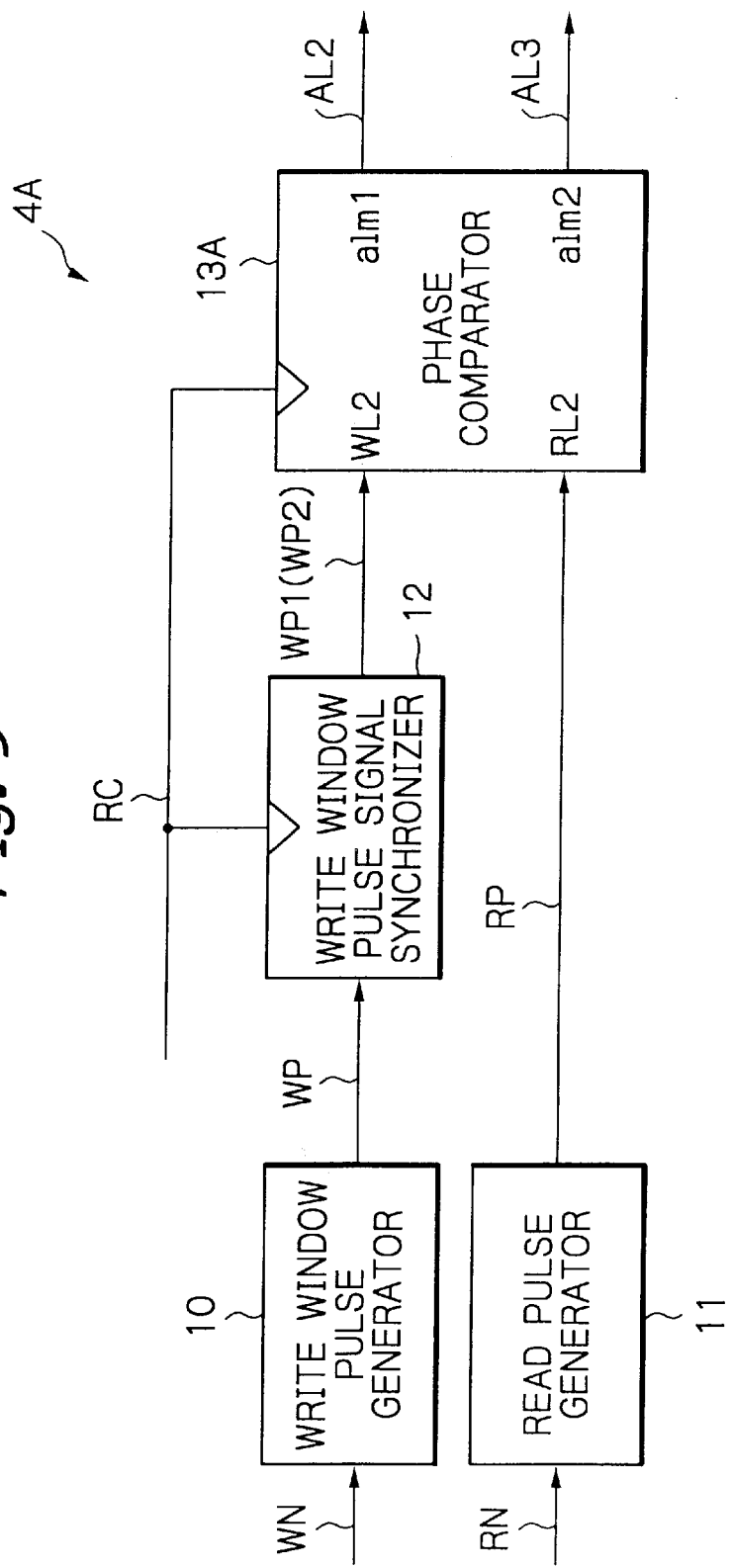
FIG. 9 is a schematic block diagram showing a specific configuration of a conflict detector particular to the third embodiment.

Reference will be made to FIGS. 8 and 9 for describing a third embodiment of the clock switching circuitry in accordance with the present invention. The following description will concentrate on differences between the first and second embodiments and the third embodiment. Briefly, the third embodiment positively identifies the direction of a conflict described with reference to FIGS. 4 and 7 and varies the value to which the read address value should jump in accordance with the identified direction. Such a procedure successfully sets up a more preferable phase difference after a jump.

FIG. 8 shows essential part of the illustrative embodiment while FIG. 9, which is basically identical with FIG. 6, shows a specific configuration of the conflict detector 4A. As shown, the conflict detector 4A identifies the direction of a conflict and outputs either one of alarm signals AL2 or AL3 in accordance with the identified direction. For this purpose, the phase comparator 13A included in the conflict detector 4A has a specific configuration shown in FIG. 10.

Figure 10:
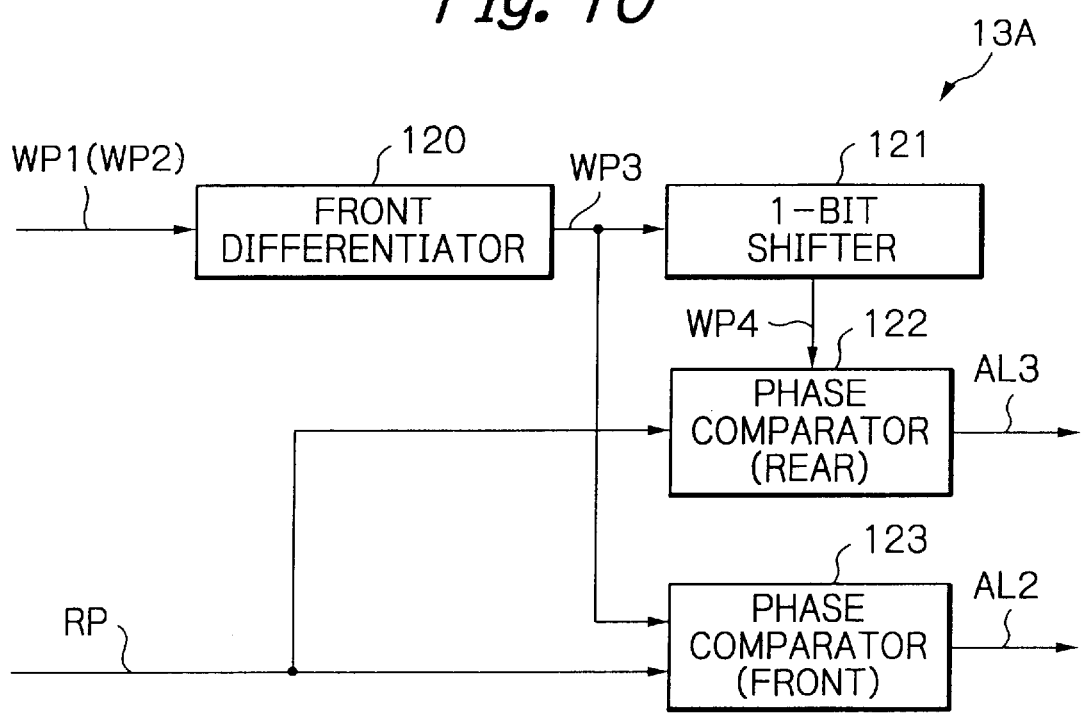
FIG. 10 is a schematic block diagram showing a specific configuration of a phase comparator also particular to the third embodiment.
Figure 11:
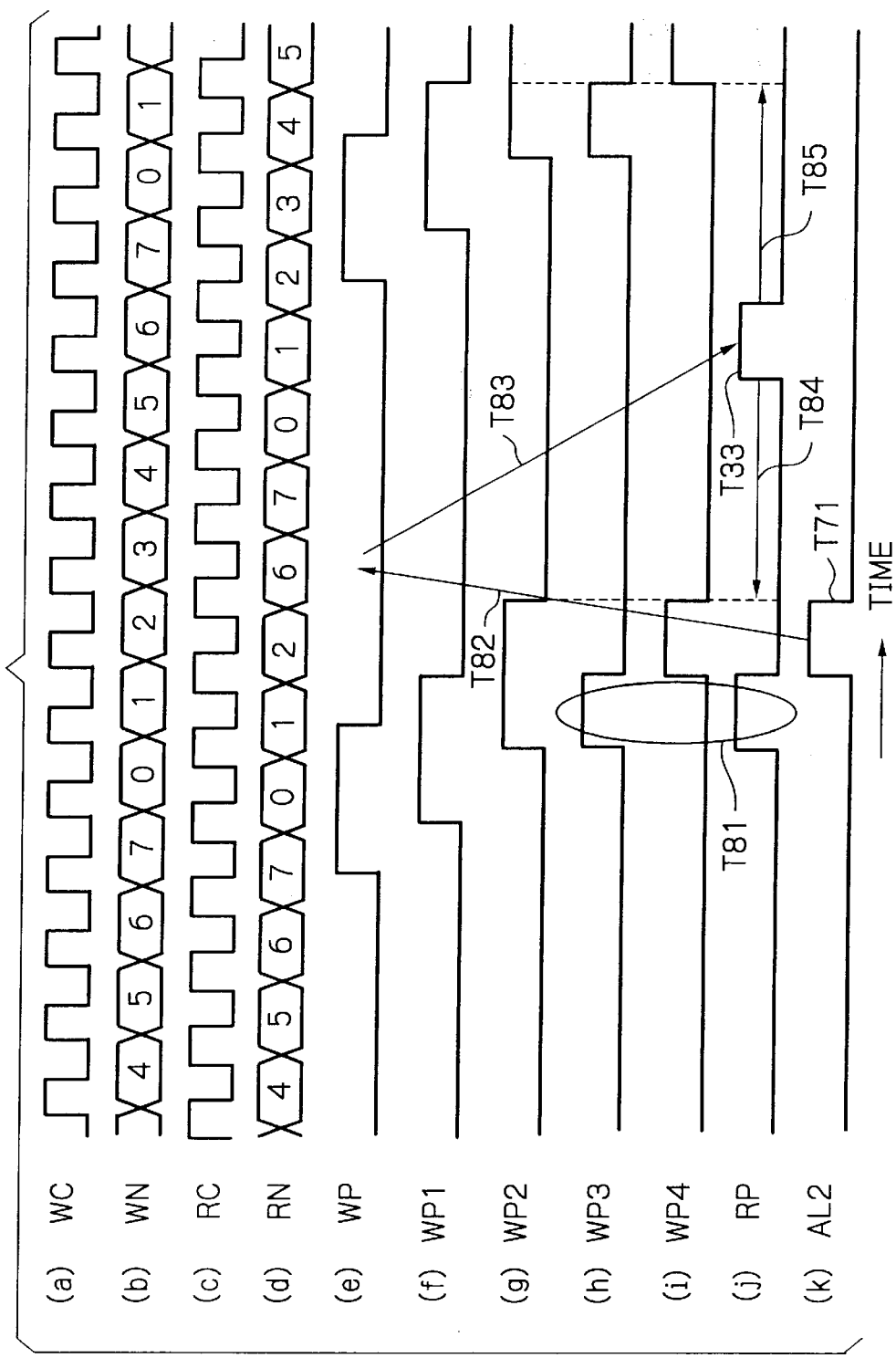
FIG. 11 is a timing chart representative of a specific operation of the third embodiment.

As shown in FIG. 10, the phase comparator, labeled 13A, includes a front differentiator 120, a one-bit shifter 121, phase comparators 122 and 123. FIG. 11, line (g), and FIG. 12, line (g), each show the write window pulse WP2 carried on the read clock RC and shifted by one bit duration. The front differentiator 120 executes front differentiation with the write window pulse signal WP2. Front differentiation reduces the duration of the high level and therefore duty ratio. In the illustrative embodiment, the front differentiator 120 effects front differentiation that reduces the duration of the high level from two clock periods to one clock period, thereby generating a write window pulse signal WP3 shown in FIG. 11, line (h), or FIG. 12, line (h). The front differentiator 120 may use the read clock RC for differentiation, if necessary.

Figure 12:
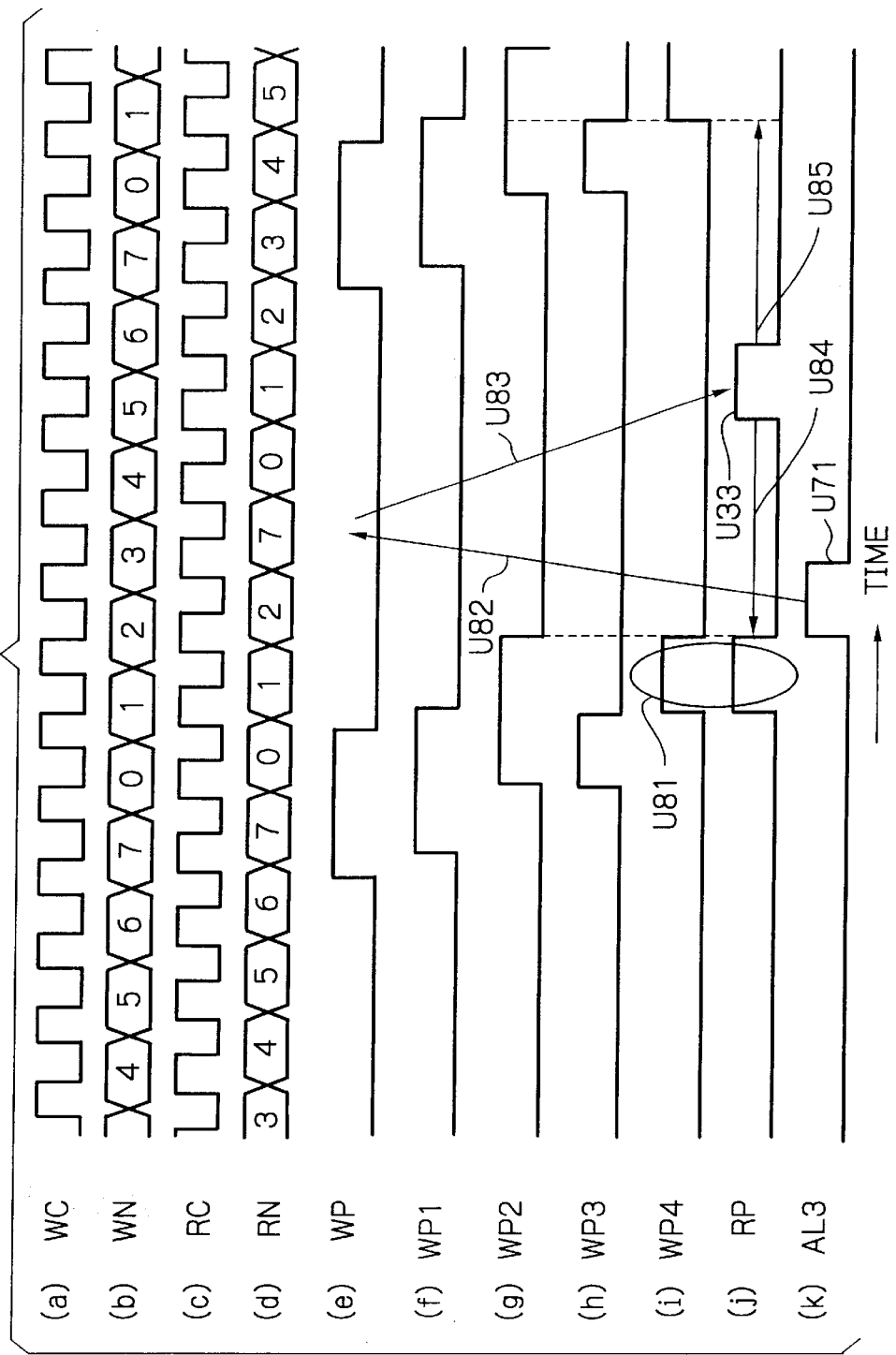
FIG. 12 is a timing chart representative of another specific operation of the third embodiment.

The write window pulse signal WP3 shown in FIG. 11, line (h) or FIG. 12, line (h), is input to the one-bit shifter 121. The one-bit shifter 121 shifts the phase of the pulse signal WP3 by one clock period to thereby generate a write window pulse signal WP4 shown in FIG. 11, line (i), or FIG. 12, line (i). The one-bit shifter 121 may be implemented by a single D-FF configured to receive the read clock RC at its clock input terminal.

In the phase comparator 13A, the one phase comparator 122 compares the phase of the read pulse signal RP received from the read pulse generator 11 with that of the write window pulse signal WP4. The other phase comparator 123 compares the phase of the read pulse signal RP with that of the original write window pulse signal WP3 not shifted by one bit duration. The two phase comparators 122 and 123 respectively deliver the alarm signals AL3 and AL2 to the read pointer 2A when the phases of the input signals overlap each other.

The alarm signal AL2 output from the phase comparator 123 shows that a conflict from the front has occurred. In response to the alarm signal AL2, the read pointer 2A determines that a conflict T81 from the front has occurred. The read pointer 2A then outputs an alarm T71 for thereby causing the read address value RN to jump from "2" to "6", as indicated by, e.g., an arrow T82 in FIG. 11, line (d). Further, the read pointer 2A causes a high level T33 to occur in the read pulse signal RP next, as indicated by an arrow T83. This prevents a conflict from repeating. It is to be noted that phase differences T84 and T85 before and after the high level T33 are equal to each other.

The other alarm signal AL3 output from the phase comparator 122 shows that a conflict U81 from the rear has occurred. In response to the alarm signal AL3, the read pointer 2A determines that the conflict T81 is from the front. The read pointer 2A then causes the read address value RN to jump from "2" to "7", as indicated by, e.g., an arrow U82 in FIG. 12, line (d). Further, the read pointer 2A causes a high level U33 to occur in the read pulse signal RP next, as indicated by an arrow U83. This also prevents a conflict from repeating. It is to be noted that phase differences U84 and U85 before and after the high level U33 are equal to each other.

As stated above, the illustrative embodiment varies the value to which the read address value RN should jump, depending on whether the conflict with the write window pulse signal WP2 is from the front or from the rear, thereby optimizing the phase difference after the jump. This further reduces the probability that a conflict repeats. The illustrative embodiment, of course, achieves the advantages described in relation to the second embodiment.

In the first to third embodiments shown and described, the read pointer and write pointer both are implemented by a free-running counter. If desired, the free-running counter may be replaced with a Johnson counter or a binary counter so long as it can generate a pointer signal. Also, the counter may be adapted to decrement its count instead of incrementing it as in the illustrative embodiments.

The write window pulses generated in the illustrative embodiments have a long duration each. Such write window pulses may be replaced with write pulses equal in duration to the read pulses, if necessary. The memory 3, write pointer 1 and so forth may be adapted to operate in response to negative-going edges instead of positive-going edges.

In any one of the illustrative embodiments, the bit synchronizing circuit cannot control the write clock WC or the write address value WN incremented in response to the write clock WC and therefore controls the read address value RN. Generally, however, there may occur a case wherein the write address value WN can be controlled, but the read address value RN cannot be controlled, or a case wherein the write address value WN and read address value RN both can be controlled. In such cases, it is possible to control the write address value RN or both of the write address value WN and read address value WN.

While k and n are assumed to be 1 in the illustrative embodiments, they may be 2 or greater integer, if desired.

In the illustrative embodiments, the high level of the read pulse signal RP continues only in a single clock period. Therefore, even when the read address value RN jumps on the detection of a conflict, incorrect reading-out of data from the storage location addressed by the read address value RN (=WN) where the conflict has occurred has already been effected at least once. In light of this, the high level of the read pulse signal RP may be modified to continue in two or more clock periods, so that the read address value RN can jump before the conflict occurs. This practically obviates conflicts. This is also true when the high level of the write window pulse signal WP is modified to continue in three or more clock periods.

In summary, it will be seen that the present invention provides clock switching circuitry capable of detecting a conflict with high reliability and facilitating design work that uses, e.g., a CAD tool.

The entire disclosure of Japanese patent application No. 2001-245190 filed on Aug. 13, 2001, including the specification, claims, accompanying drawings and abstract of the disclosure is incorporated herein by reference in its entirety.

While the present invention has been described with reference to the particular illustrative embodiments, it is not to be restricted by the embodiments. It is to be appreciated that those skilled in the art can change or modify the embodiments without departing from the scope and spirit of the present invention.

What is claimed is:
1. Clock switching circuitry comprising:
   a memory having a plurality of storage locations of a particular address each for allowing data to be written into and read out from the plurality of storage locations at the same time;
   a write pointer for causing a write address addressing a storage location to vary in synchronism with a write clock;

a read pointer for causing a read address addressing a storage location to vary in synchronism with a read clock;

a synchronizer for selectively executing first synchronization for synchronizing a phase of the write address with the read clock to generate a synchronized write address or second synchronization for synchronizing a phase of the read address with the write clock to generate a synchronized read address;

a conflict detector for outputting an alarm signal when determining that a phase difference between the write address and the synchronized read address is smaller than a preselected reference value or that a phase difference between the read address and the synchronized write address is smaller than the preselected reference value; and a conflict avoiding circuit for executing, in response to the alarm signal, a conflict avoiding operation that causes the write address and the read address to differ from each other by at least the reference value.

2. The circuitry in accordance with claim 1, wherein said plurality of storage locations are two storage locations corresponding to a phase difference, which is necessary for executing simultaneous writing and reading of data to switch a clock to carry the data, and is plus and minus one clock pulse duration.

3. The circuitry in accordance with claim 2, wherein the write clock is obtained from a transmission interface, and said plurality of storage locations are 4+2k (k being 1 or greater integer) locations, which comprise:
2k storage locations necessary for switching the clock to carry the data and to execute, during clock switching, a delay variation absorbing operation that absorbs influence of plus and minus k bits of variation of a delay time occurring on the transmission path; and two storage locations corresponding to the phase difference, which is necessary for executing the conflict avoiding operation and for allowing a phase limitation on the read clock to be canceled and is a plus and a minus one clock pulse duration.

4. The circuitry in accordance with claim 1, wherein said conflict avoiding circuit comprises:

a write window pulse generator for generating a write window pulse signal having a duration, which corresponds to a sum of a minimum duration necessary for detecting closeness of the phase difference to the reference value and a duration of one write clock pulse, synchronous with the write clock, and indicative of a timing for writing the data in said memory in accordance with the write address;

a clock switching circuit for feeding, as a subject of the first synchronization, the write window pulse signal to said synchronizer in place of the write address for synchronizing the write window pulse signal with the read clock;

a read pulse generator for generating a read pulse signal having a minimum pulse duration, which is necessary for detecting closeness of the phase difference to the reference value, synchronous with the read clock, and indicative of a phase of reading-out of the data from said memory in accordance with the read address; and a phase comparator for comparing a phase of the read pulse signal with a phase of the write window pulse signal to detect the closeness.

5. The circuitry in accordance with claim 4, further comprising:

a front pulse generator for generating, based on the write window pulse signal, a front pulse signal to be positioned at a front portion of a pulse duration of the write window pulse signal; and a front phase comparator for comparing a phase of the front pulse signal with a phase of the read pulse signal to determine whether or not the closeness occurs from a front.

6. The circuitry in accordance with claim 4, further comprising:

a rear pulse generator for generating, based on the write window pulse signal, a rear pulse signal to be positioned at a rear portion of a pulse duration of the write window pulse signal; and a rear phase comparator for comparing a phase of the rear pulse signal with the phase of the read pulse signal to determine whether or not the closeness occurs from a rear.

7. The circuitry in accordance with claim 4, wherein the write clock is obtained from a transmission interface, and said plurality of storage locations are 5+2k+n (k and n both being 1 or greater integer) locations, which comprise:
two storage locations corresponding to a phase difference, which is necessary for executing simultaneous writing and reading of data to thereby switch a clock to carry the data, and is plus and minus one clock pulse duration; 2k storage locations necessary for switching the clock to carry the data and to execute, during clock switching, a delay variation absorbing operation that absorbs influence of plus and minus k bits of variation of a delay time occurring on the transmission path;

two storage locations necessary for executing the conflict avoiding operation and for allowing a phase limitation on the read clock to be canceled; and n+1 storage locations corresponding to a phase difference of n, which is determined by a duration of a high level of n+1 assigned to the write window pulse signal and is necessary for said conflict detector to detect a conflict, and one clock pulse duration.

* * * * *